(12) United States Patent
Newcomb (10) Patent No.: US 9,476,118 B2
(45) Date of Patent: Oct. 25, 2016

(54) ADJUSTABLE SHUNT ASSEMBLY FOR A SPUTTERING MAGNETRON AND A METHOD FOR ADJUSTING SUCH A SHUNT

(71) Applicant: Angstrom Sciences, Inc., Duquesne, PA (US)

(72) Inventor: Richard Newcomb, McKeesport, PA (US)

(73) Assignee: Angstrom Sciences, Inc., Duquesne, PA (US)

(*) Notice: Subject to any disclaimer, the term of this patent is extended or adjusted under 35 U.S.C. 154(b) by 418 days.

(21) Appl. No.: 14/071,098

(22) Filed: Nov. 4, 2013

(65) Prior Publication Data

US 2014/0158523 A1   Jun. 12, 2014

Related U.S. Application Data

(60) Provisional application No. 61/735,294, filed on Dec. 10, 2012.

(51) Int. Cl.
| | |
|---|---|
| C23C 14/00 | (2006.01) |
| C23C 14/35 | (2006.01) |
| C23C 14/54 | (2006.01) |
| H01J 37/34 | (2006.01) |

(52) U.S. Cl.
CPC ............... *C23C 14/35* (2013.01); *C23C 14/54* (2013.01); *H01J 37/3408* (2013.01); *H01J 37/3455* (2013.01); *H01J 37/3461* (2013.01)

(58) Field of Classification Search
CPC .................................................. H01J 37/3461
See application file for complete search history.

(56) References Cited

U.S. PATENT DOCUMENTS

| | | | |
|---|---|---|---|
| 5,407,551 A | 4/1995 | Sieck et al. | |
| 5,415,754 A * | 5/1995 | Manley | C23C 14/35 204/192.12 |
| 5,685,959 A * | 11/1997 | Bourez | C23C 14/3407 204/192.15 |
| 5,876,576 A * | 3/1999 | Fu | C23C 14/35 204/192.12 |
| 2004/0178056 A1* | 9/2004 | De Bosscher | H01J 37/3405 204/192.12 |
| 2010/0018854 A1* | 1/2010 | McLeod | C23C 14/3407 204/192.12 |
| 2011/0186427 A1 | 8/2011 | Bernick et al. | |
| 2012/0261253 A1* | 10/2012 | Madocks | C23C 14/3407 204/192.1 |

* cited by examiner

*Primary Examiner* — Keith Hendricks
*Assistant Examiner* — Timon Wanga
(74) *Attorney, Agent, or Firm* — The Webb Law Firm (57) ABSTRACT

An adjustable shunt assembly for use with a sputtering magnetron having at least two magnets spaced from one another and disposed with respect to a sputtering target having a sputtering surface. The magnets define a longitudinal axis and the adjustable shunt assembly moves a shunt between the two magnets for altering the magnetic field therebetween. A transporter is used for moving the shunt so that such movement may be occurred without disassembling the components of the magnetron and such movement may also be done remotely. A method for moving such shunts is also disclosed.

23 Claims, 10 Drawing Sheets

ADJUSTABLE SHUNT ASSEMBLY FOR A SPUTTERING MAGNETRON AND A METHOD FOR ADJUSTING SUCH A SHUNT

CROSS REFERENCE TO RELATED APPLICATION

This application claims the benefit of U.S. Provisional Application No. 61/735,294 filed Dec. 10, 2012, and for which the disclosure is hereby incorporated in its entirety by reference.

BACKGROUND OF THE INVENTION

1. Field of the Invention

The present invention relates to a sputtering magnetron having an adjustable shunt for fine tuning the magnetic field.

2. Description of Related Art

Magnetron sputtering is widely used for depositing layers of thin films of material onto a substrate. The process involves vaporizing a material by ion bombardment of a target which forms part of a cathode in an evacuated chamber containing an inert gas such as argon. A high voltage electric field is applied between the cathode and an anode in the chamber, and the gas is ionized by collision with electrons ejected from the surface of the cathode. The positive gas ions are attracted to the cathode surface and atoms of material dislodge when the ions strike the target, traverse the enclosure and deposit as a thin film onto a substrate positioned on a support maintained at or near anode potential.

In such a magnetron sputter coating process, the sputtering of materials from the sputtering target occurs most rapidly in regions of the target where the plasma trapped by the magnetic field is most dense. This localized region of trapped plasma erodes a narrow groove in the target, resulting in poor target utilization and generating a non-uniform distribution of sputtered atoms. Typically, the deposition of material from the target onto the substrate is correspondingly non-uniform, where often a film having a greater thickness at the target outer edge is sputtered as a function of target life.

Although the sputtering process can be carried out solely in an electric field, substantially increased and more uniform deposition rates are possible with magnetron sputtering in which an arched closed-loop magnetic field, formed in a closed loop over the surface of the sputtering target, is superimposed on the electric field. The arched closed-loop magnetic field traps electrons in an annular region adjacent to the surface of the target, thereby multiplying the collisions between electrons and gas atoms to produce a corresponding increase in the number of and better control of ions in that region.

Additionally, many applications of sputtering thin films require very precise uniformity tuning of the deposited layer. This is especially true for thin films which are individual layers of an optical interference filter such as low-emissivity films. New technologies for these films can require each layer to be within ±1.5% physical thickness across the entire substrate in order to meet product specifications.

Large magnetrons used for producing thin films have histories to companies that are no longer in existence. Many advancements have been made over the core technology which includes altering magnetic field so that the thin film uniformity can be tuned. It has been shown that changes as small as 1 mm, from a strategically placed shunt, can lead to uniformity shifts in the same location by an approximately 1%.

The sputtering magnetrons which are used to deposit these films can be tuned by altering the magnetic field profile/intensity within the magnet pack. Such tuning is required because, over time, the target erodes, the anodes become coated, gas flow shifts and as a result, the uniformity may drift out of specification. To re-tune the magnetron, the user must stop the process, physically remove the sputtering magnetron, and disassemble the cathode to make adjustments to the internal components, which are the magnets and the shunts. This procedure can cause a twelve hour or longer delay in production and then can require even further stoppage in the event more tuning is required. Furthermore, such tuning is required when a new target is installed.

SUMMARY OF THE INVENTION

The subject invention provides a method and assembly for adjusting the magnets while in production so changes can be made "on the fly" with no stoppage of production. The user is able to control a change to the magnetic intensity/profile, know how much change has been made, and make such a change for the entire length of the magnetron or just a specific location, as desired.

One embodiment of the subject invention is directed to an adjustable shunt assembly for use in a sputtering magnetron having at least two magnets spaced from one another and disposed with respect to a sputtering target having a sputtering surface. The magnets define a longitudinal axis therebetween, wherein the magnets are adapted to provide opposing north and south poles producing a magnetic field over the target sputtering surface for magnetron sputtering. The adjustable shunt assembly comprising has a) a shunt positioned between two adjacent magnets for altering the magnetic field therebetween and b) a transporter for moving the shunt relative to the magnets within a range between first and second positions at which the magnetic field on the target surface causes preferential target erosion.

Another embodiment is directed to a sputtering magnetron for displacing material from a target and depositing the material onto the receiving surface of a substrate. The magnetron has a base having a cathode mounted thereto, wherein the cathode is comprised of at least two magnets defining a longitudinal axis therebetween. The magnets are spaced in an opposing fashion from one another and disposed with respect to a sputtering target to provide opposing north and south poles producing a magnetic field over the target sputtering surface for magnetron sputtering. The magnetron also has a sputtering target with a cathode side and a sputtering surface side, wherein the cathode side faces the cathode and wherein the cathode is adapted to displace electrically charged material from the sputtering surface side. The magnetron further has an anode substrate with a receiving surface, wherein the sputtering surface side of the target faces the receiving surface of the anode substrate. The anode substrate is adapted to attract the electrically charged material from the target onto the receiving surface. The magnetron also has a plurality of adjustable shunt assemblies secured along the length of the base. Each adjustable shunt assembly is comprised of: 1) a shunt positioned between two adjacent magnets for altering the magnetic field therebetween and 2) a transporter for moving the shunt relative to the magnets within a range between first and second positions at which the magnetic field on the target surface causes preferential target erosion.

Yet another embodiment of the subject invention is directed to a method for adjusting the magnetic field of a sputtering magnetron to provide preferential erosion. The magnetron has at least two magnets spaced parallel from one another and defining a longitudinal axis therebetween. The magnets are disposed with respect to a sputtering target having a sputtering surface. The magnets are adapted to provide opposing north and south poles producing a magnetic field over the target sputtering surface for magnetron sputtering. The method comprising the steps of: a) providing at least one shunt between two adjacent magnets for altering the magnetic field therebetween; and b) moving the at least one shunt relative to the magnets within a range between first and second positions at which the magnetic field on the target surface causes preferential target erosion.

DESCRIPTION OF THE PREFERRED EMBODIMENTS

Figure 1:
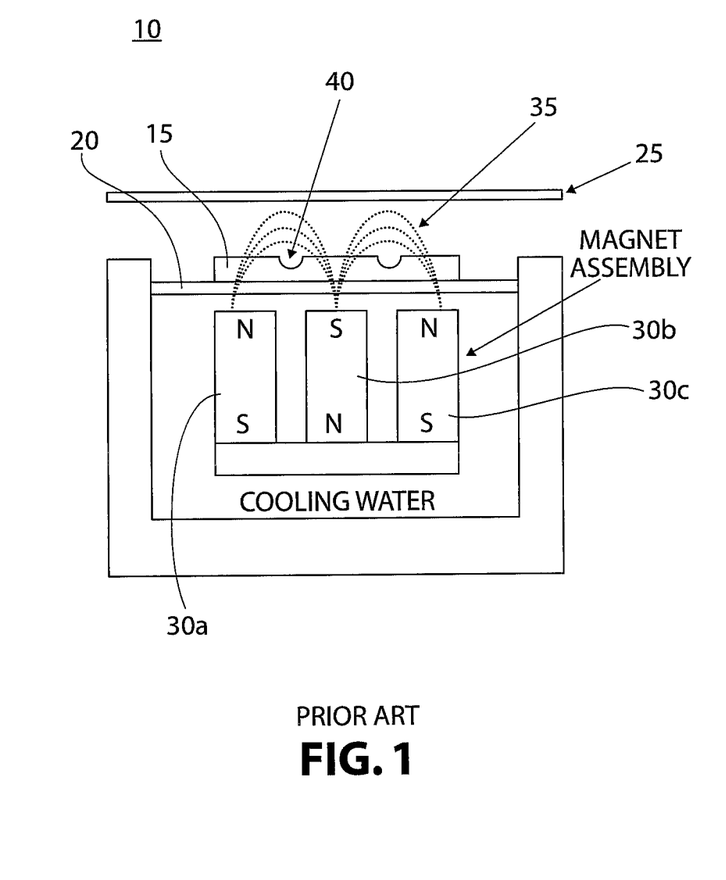
FIG. 1 is prior art and is a cross sectional schematic of a sputtering magnetron and a substrate upon which target material is deposited.

FIG. 1 illustrates a prior art arrangement of a cross section of a sputtering magnetron 10, wherein a target 15 rests upon a backing plate 20. High direct current voltage is provided to the target 15 such that the target 15 acts as a cathode. The high voltage through the target vaporizes a portion of the target to provide a plasma local to the target region. Gas around the target is ionized by collisions with electrons ejected from the surface of the cathode and these ions impact the cathode surface to dislodge atoms of material for deposition onto the substrate 25. It is possible to influence the path the plasma travels by introducing a magnetic field within the plasma that restrains the direction in which the plasma flows. In particular, as illustrated in FIG. 1, a plurality of magnets 30a, 30b, 30c may be placed in parallel spaced relationship with one another such that the magnetic field created by the magnet, illustrated by the magnetic field lines 35, overlaps the region in which the plasma is generated. However, such an arrangement tends to create target erosion producing non-uniform target wear and, as a result, the target 20 may need to be retired before a significant portion of the material from the target has been removed. As illustrated in FIG. 1, the use of such magnets produces a sputter erosion track 40 at particular locations on the target 15.

Figure 2:
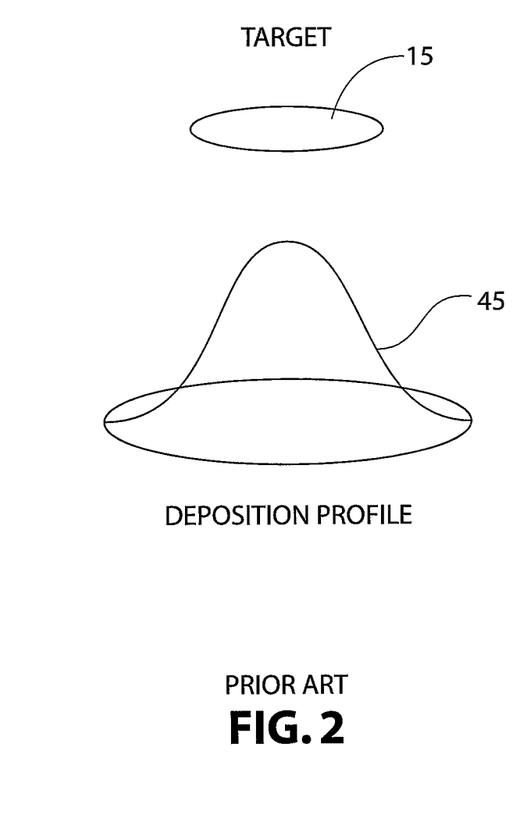
FIG. 2 is prior art and is a sketch of the deposition profile of plasma relative to a target from which material is removed.

Turning attention to FIG. 2, ideally, the magnetic field creates a deposition profile 45 that impacts the target 15 in a largely uniform manner.

Figure 3:
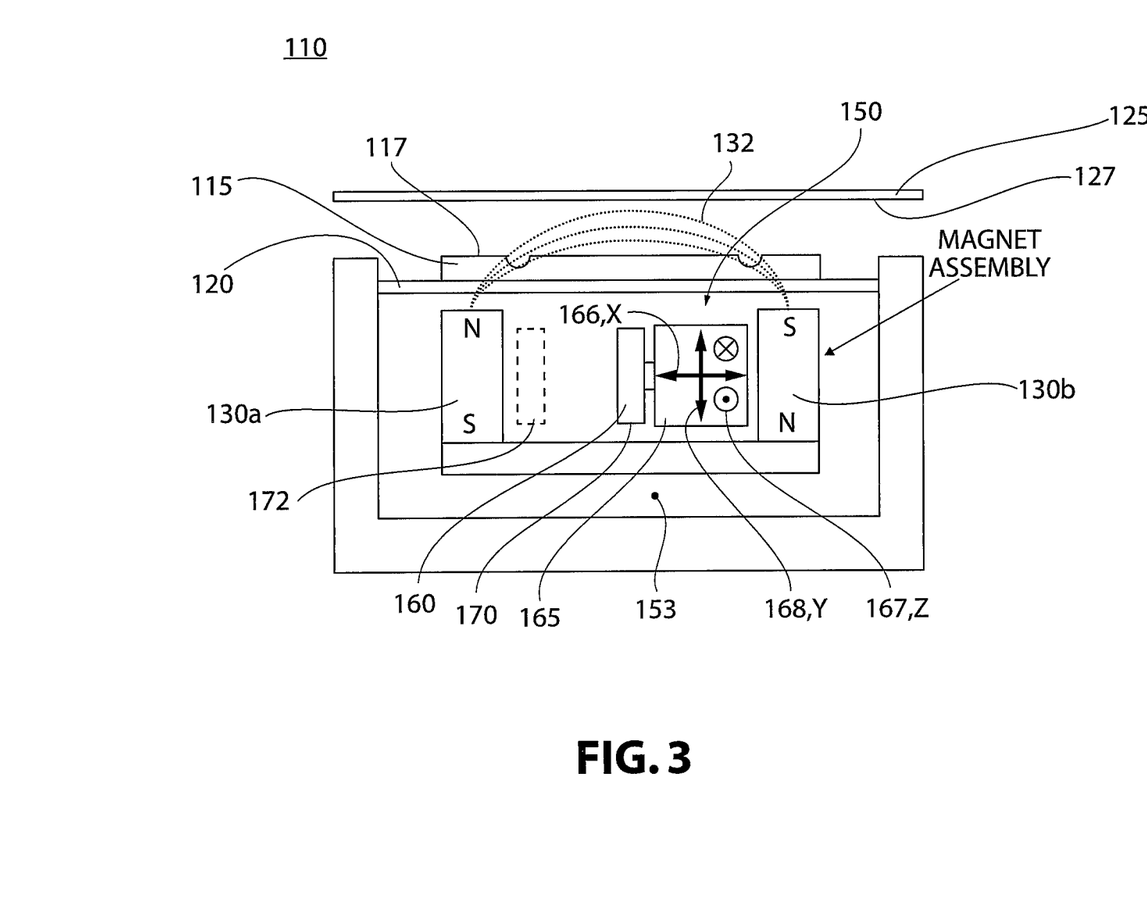
FIG. 3 is a schematic of a cross section of a sputtering magnetron in accordance with the subject invention, whereby an adjustable shunt is positioned between two magnets.

Directing attention to FIG. 3, a sputtering magnetron 110 is similar to the sputtering magnetron 10 illustrated in FIG. 1. However, for illustrative purposes, includes only two magnets 130a, 130b spaced apart in parallel relation to one another.

The subject invention is directed to an adjustable shunt assembly 150 for use in a sputtering magnetron 110 having at least two magnets 130a, 130b spaced from one another and disposed with respect to a sputtering target 115 having a sputtering surface 117. The magnets 130a, 130b are adapted to provide opposing north N and south S poles producing a magnetic field 132 over the target sputtering surface 117 for magnetron sputtering.

The adjustable shunt assembly 150 is comprised of a shunt positioned between the two adjacent magnets 130a, 130b for altering the magnetic field 132 therebetween.

A transporter 165 is connected to and moves a shunt 160 relative to the magnets 130a, 130b with a range between, for example, a first position 170 and a second position 172 at which the magnetic field 132 on the target surface 117 causes preferential target erosion. It should be appreciated that the transporter 165 may be capable of moving the shunt 170 laterally as illustrated by arrow 166, transversely into the page as illustrated by arrow 167 or vertically as illustrated by arrow 168.

Figure 4:
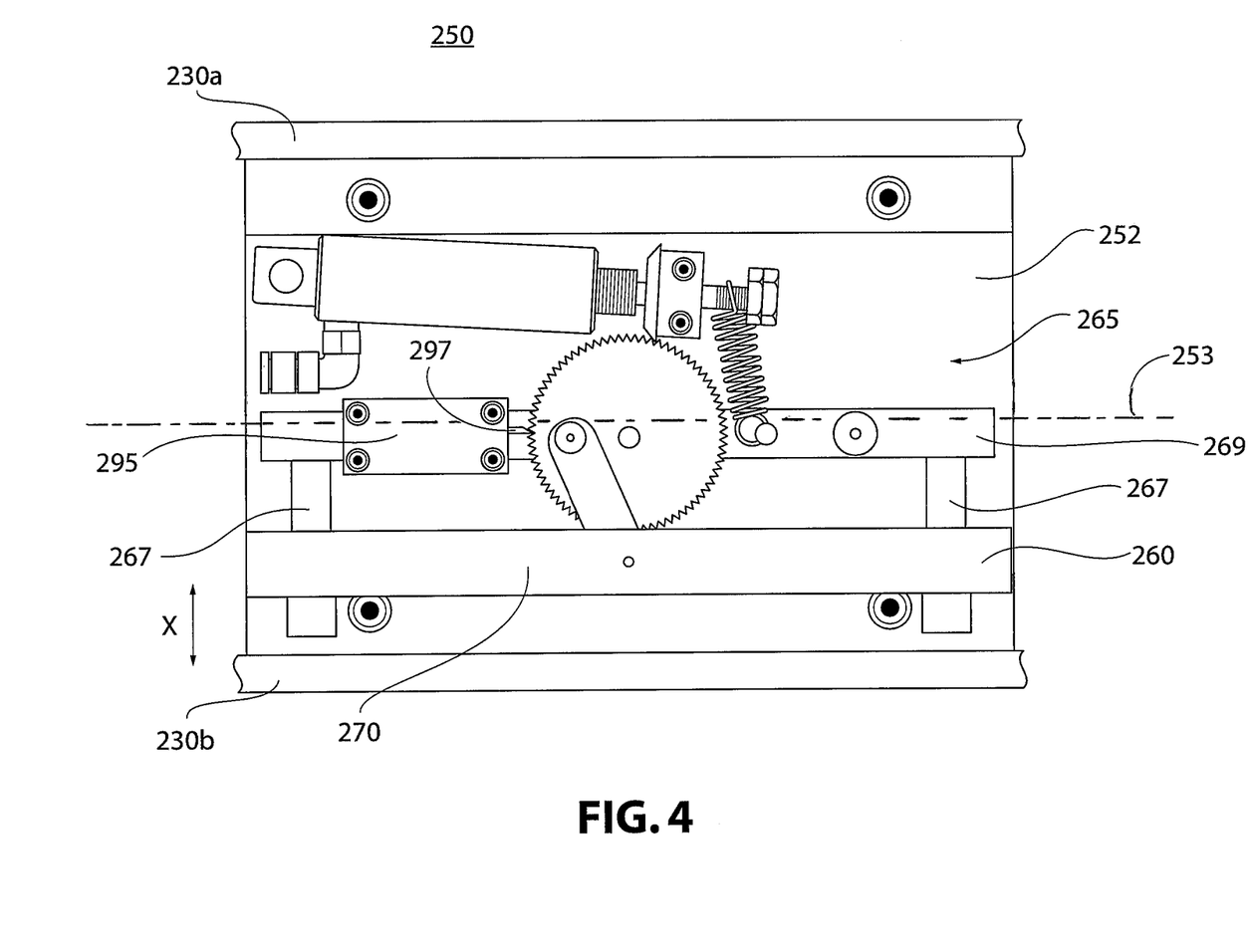
FIG. 4 shows a top view of an adjustable shunt assembly in accordance with a first embodiment of the subject invention with the shunt in a first position.
Figure 5:
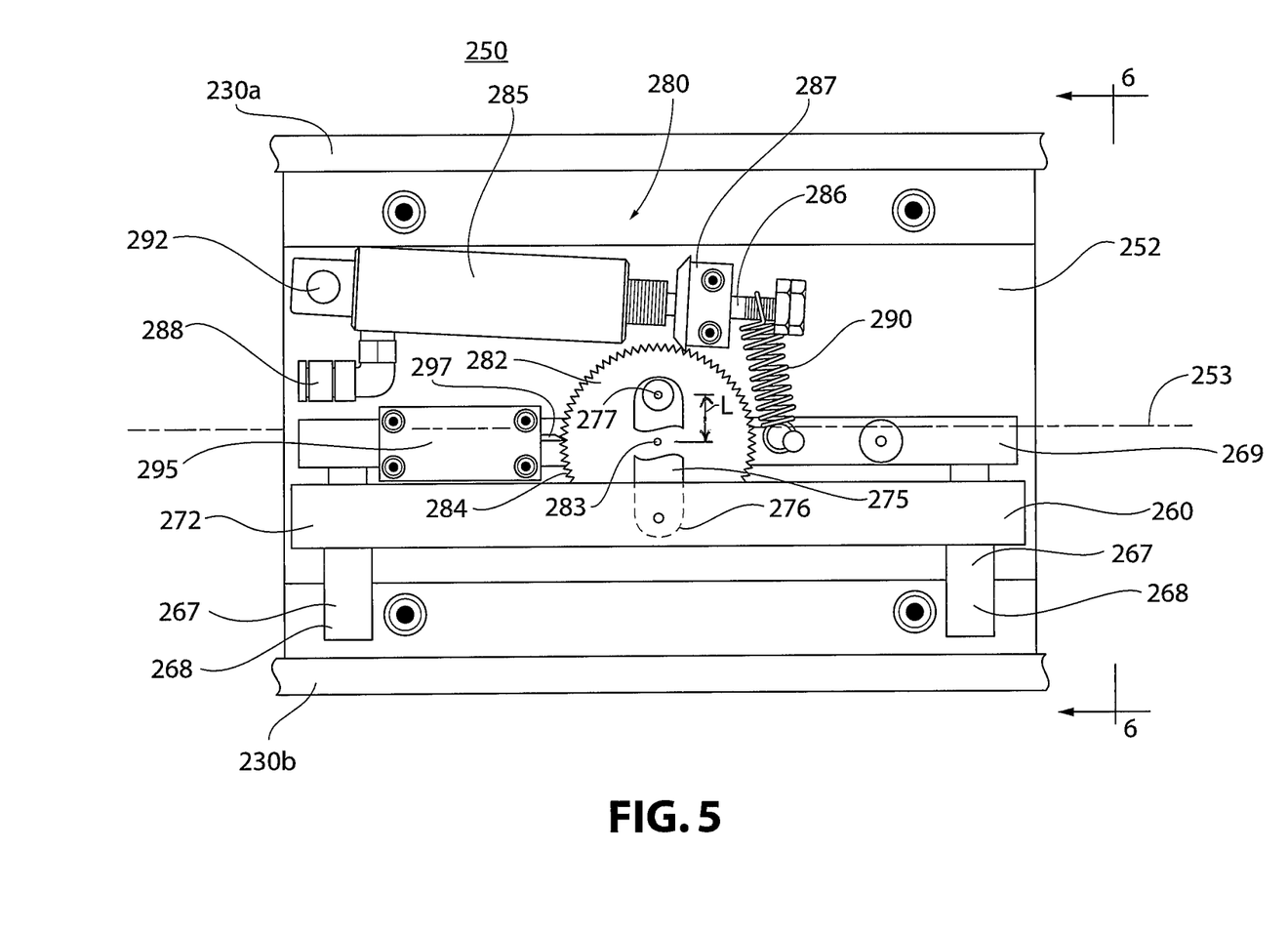
FIG. 5 shows a top view of an adjustable shunt assembly in accordance with the first embodiment of the subject invention with the shunt in a second position.
Figure 6:
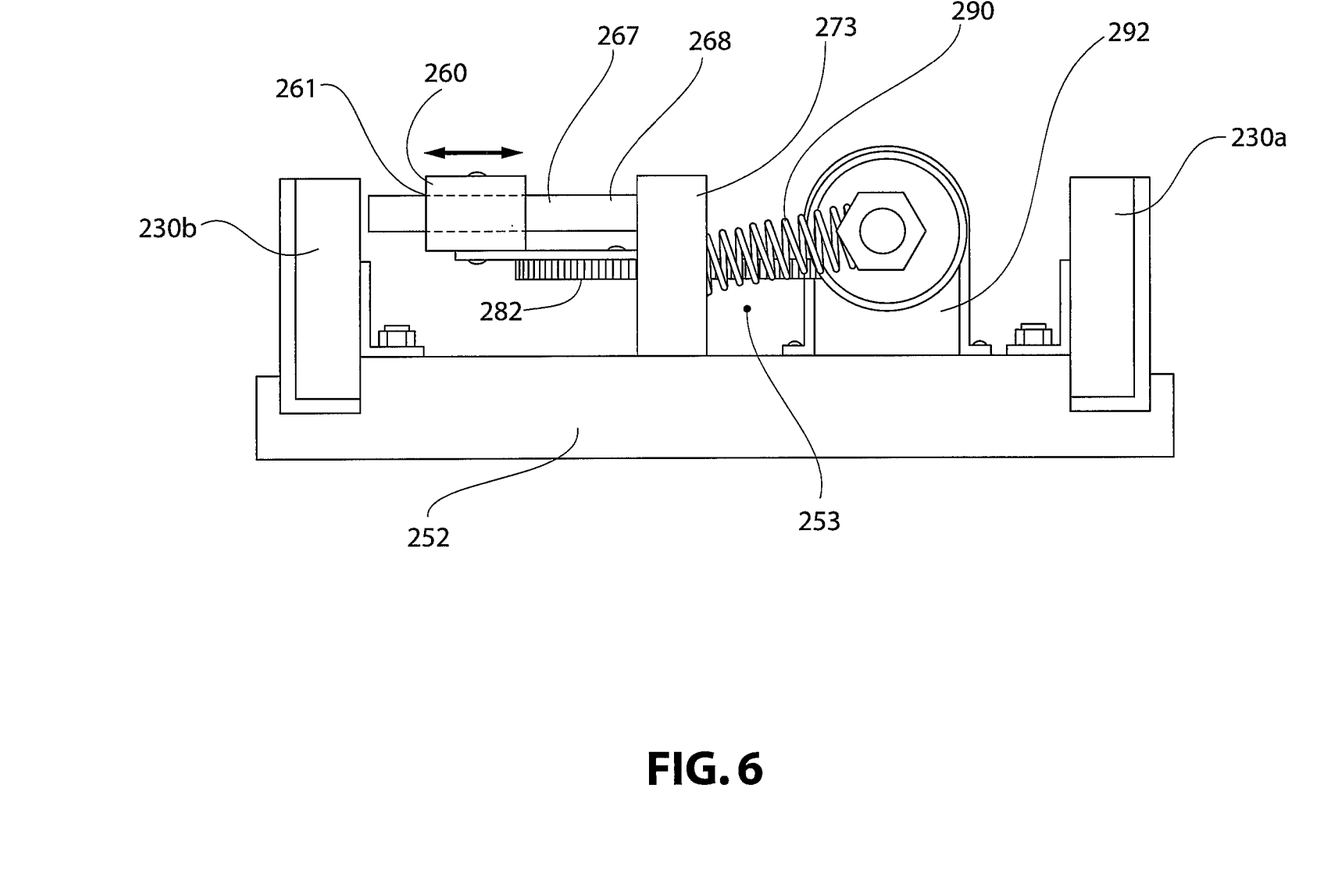
FIG. 6 is an end view of the adjustable shunt assembly illustrated in FIG. 5.

FIGS. 4-6 illustrate one embodiment of the adjustable shunt assembly. In particular, the adjustable shunt assembly 250 is comprised of a frame 252. A transporter 265 is made up of a guide 267 secured to the frame 252 through a cross member 269 which may be, for example, bolted to the frame 252. The shunt 260 is movable along the guide 267 between the magnets 230a, 230b.

In the embodiment illustrated in FIG. 4, the transporter guide 267 is oriented perpendicular to a longitudinal axis 253 extending between the magnets 230a, 230b in the lateral direction indicated by X in FIG. 4.

The adjustable shunt assembly 250 is mounted to a frame 252 and the frame 252 is positioned between the two magnets 230a, 230b. The frame is removable from the magnetron and, as a result, the adjustable shunt assembly 250 illustrated in FIG. 4 may be considered modular.

It should be appreciated that frame 252 is situated between the magnets 230a, 230b and the frame components therein may be resized such that the frame 252 may be rotated 90° with respect to the magnets 230a, 230b. Under such circumstances, the guide 267 would be parallel to the longitudinal axis 253, whereby the shunt 260 would move parallel in the direction indicated by arrow Y in FIG. 3 with respect to longitudinal axis 253.

It may further be appreciated that the frame 252 illustrated in FIG. 4 may be resized and rotated 90° about axis 253 such that the transporter guide 267 extends into the page. Under such circumstances, the shunt 260 would move in a direction vertical as indicated by arrow Z in FIG. 3 between the magnets 230a, 230b.

FIG. 4 illustrates the shunt 260 in a first position 270 relative to the magnets 230a, 230b. FIG. 5 is the same adjustable shunt assembly 250 as that illustrated in FIG. 4. However, the shunt 260 has now been relocated along the guide 267 to a second position 272.

Directing attention to FIGS. 5 and 6, the transporter guide 267 is comprised of at least one post 268 extending from the frame 252. The shunt 260 has a bore 261 matching the outer shape of the post 268 and extending through the shunt such that the shunt may slide back and forth along a path defined by the guide 267.

As illustrated in FIG. 6, the guide 267 is secured to the frame 252 through a support block 273.

Directing attention to FIGS. 5 and 6, the adjustable shunt assembly 250 is further comprised of a positive displacement lever 275 typically connected at a first end 276 to the shunt 260, wherein the lever 275 is engaged with the drive mechanism 280 such that actuation of the drive mechanism 280 displaces the shunt 260 between the magnets 230a, 230b.

The transporter 265 further includes a ratchet gear 282, a rotary motor 285, and a driving disk 287. The ratchet gear 282 is mounted upon its center 283 to the cross member 269 which is attached to the frame 252. The second end 277 of the lever 275 is pivotally attached to a location on the gear 275 offset from the center 283 of the gear 282 by a distance L. The driving disk 287 is connected to the shaft 286 of the rotary motor 285 and engages the gear teeth 284 such that rotation of the motor 285 rotates the driving disk 287 and drives the gear 282, thereby causing the shunt 260 to move along the guide 267.

The connection of lever 275 to the shunt 260 and to the gear 282 provides an arrangement whereby the shunt 260 reciprocates back and forth along the guide 267 with each full rotation of the gear 282. As a result, even though the shaft 286 of the rotary motor 285 rotates in a single direction, by way of the manner in which the lever 275 is mounted between the gear 282 and the shunt 260, any location of the shunt between the first position 270 (FIG. 4) and the second position 272 (FIG. 5) may be achieved by rotation of the shaft 286 in a single direction.

To ensure the driving disk 287 engages the gear teeth 284 of gear 282, a coil spring 290 attached to the cross member 269 and to the shaft 286 of the rotary motor 285 biases the driving disk 287 against the gear teeth 284.

While the driving disk 287 drives the gear 282 and positions the shunt 260 along the guide 267, to ensure the shunt 260 remains in position, a position lock 295 urges a locking tab 297 to engage the gear teeth 284 to prevent undesirable rotation of the gear 282. The tab 297 may be beveled and spring-loaded against the gear teeth 284 such that rotation of the gear 282 is permitted in one direction and prevented in another direction.

In operation, the rotary motor, which may be pneumatically powered by supply line 288, is activated such that the driving disk 287 rotates which in turn engages the gear teeth 284 of the ratchet gear 282 to rotate the gear 282. The lever 275 which is attached to the gear 282 at a distance L from the center 283 of the gear 282 is also pivotally attached to the shunt 270 at the first end 276 of the lever 275. As a result, as the ratchet gear 282 rotates, the second end 277 of the lever 275 follows the gear and drives the shunt 260 back and forth on the guide 267. In this manner, the shunt 260 may be positioned anywhere between a first position 270 illustrated in FIG. 4 and a second position 272 illustrated in FIG. 5.

Directing attention to FIGS. 5 and 6, the rotary motor 285 includes a pivot attachment 292, whereby the rotary motor 285 is secured to the frame 252 but is also permitted rotation about the pivot attachment 292.

Figure 7:
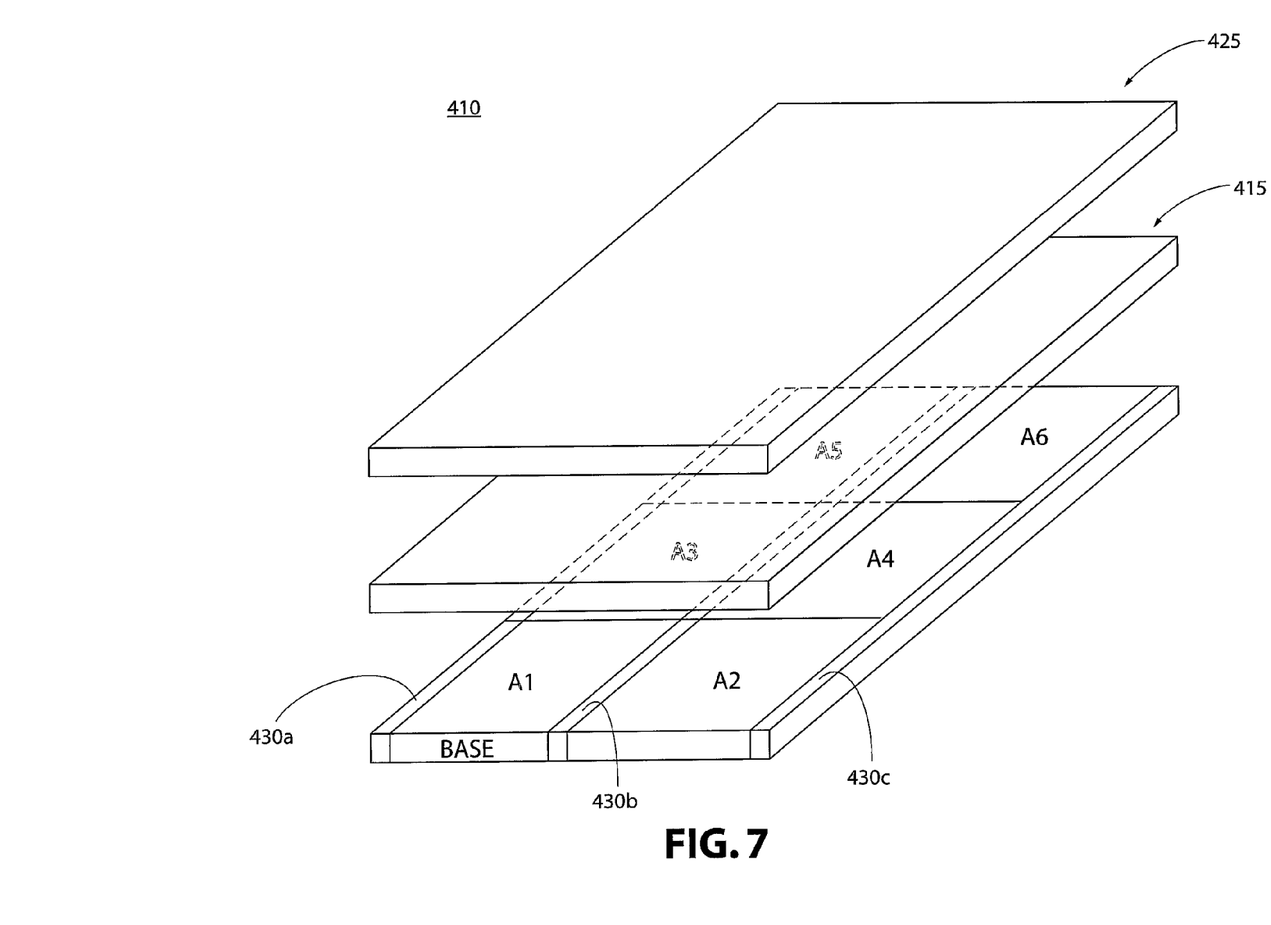
FIG. 7 is a perspective schematic of a sputtering magnetron utilizing a plurality of adjustable shunt assemblies.

Directing attention to FIG. 7, a schematic of a sputtering magnetron 410 illustrates a target 415, a substrate 425, and a plurality of adjustable shunt assemblies A1-A6 between magnets 430a, 430b, and 430c. Each adjustable shunt assembly A1-A6 may be interchangeable with another but, furthermore, each adjustable shunt assembly A1-A6 may be operated independently such that the position of the shunt in each of the adjustable shunt assemblies A1-A6 may be at a different location to accommodate the needs of the particular magnetron sputtering operation.

Key to this invention is the ability to relocate the shunt 260 (FIG. 5) relative to the magnets 230a, 230b without the need of disassembling any portion of the shunt assembly. In accordance with the subject invention, such an adjustment may be done remotely through the use of the hydraulically operated rotary motor 285. Such an arrangement not only saves significant time for initial installation but, furthermore, continues to save significant time when minor adjustments to the shunt must be made.

Figure 8:
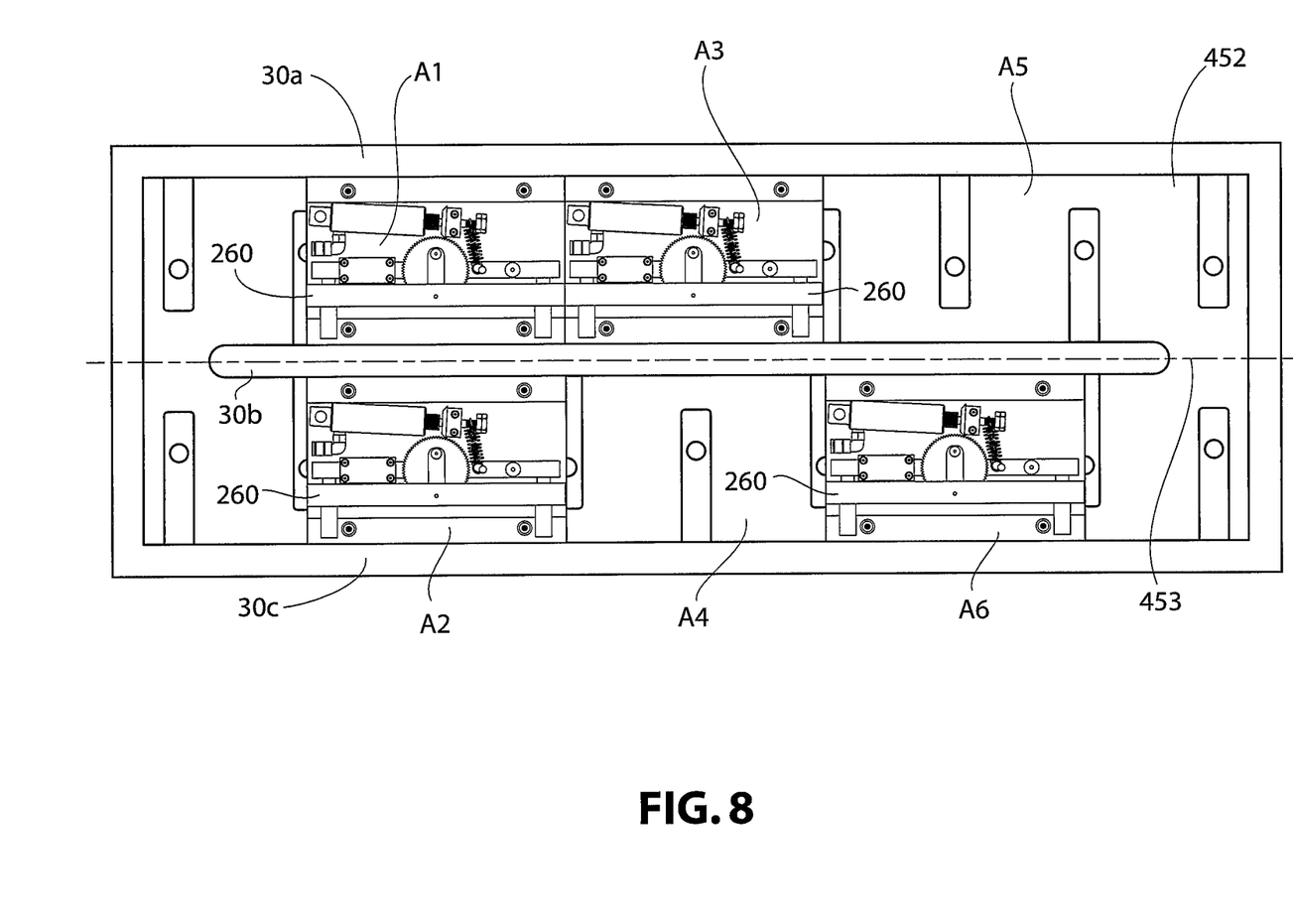
FIG. 8 is a top view of a sputtering magnetron showing a plurality of adjustable shunt assemblies positioned for operation.

FIG. 8 illustrates the adjustable shunt assemblies A1-A6 shown schematically in FIG. 8. The shunt assemblies A4 and A5 are not illustrated but the frame 452 is exposed to show the manner by which the adjustable shunt assemblies A4, A5 are secured thereto. In the embodiment illustrated in FIG. 8 the magnets 30a, 30b, 30c are secured to the frame 452 completely independent of the adjustable shunt assemblies A1-A6.

As previously mentioned, if one or more of the adjustable shunt assemblies A1-A6 were scaled down and rotated clockwise by 90°, then the shunts 260 and each of them could be moved in a direction parallel to the longitudinal axis 453 of the magnetron 410. It should further be noted that the adjustable shunt assembles A1-A6 may be rotated in a direction about the longitudinal axis 453 by 90° such that now, the shunts 260 could be moved in a vertical direction in and out of the page.

Depending upon the tuning required by the sputtering magnetron, it is also possible to install adjustable shunt assemblies, wherein one or more of the adjustable shunt assemblies move the shunt in different directions. As an example, briefly returning to FIG. 8, adjustable shunt assembly A1 moves the shunt 260 in a direction perpendicular to the longitudinal axis 453. However, if adjustable shunt assembly A1 was resized and rotated 90° in a clockwise direction, then shunt 260 of adjustable shunt assembly A1 would move in a direction parallel to the longitudinal axis. It is also possible to include a module that would move the shunt 260 in a vertical direction.

What has so far been described is an adjustable shunt assembly utilizing a ratchet gear at an offset lever to reciprocate the shunt back and forth along the guide.

Figures 9, 10:
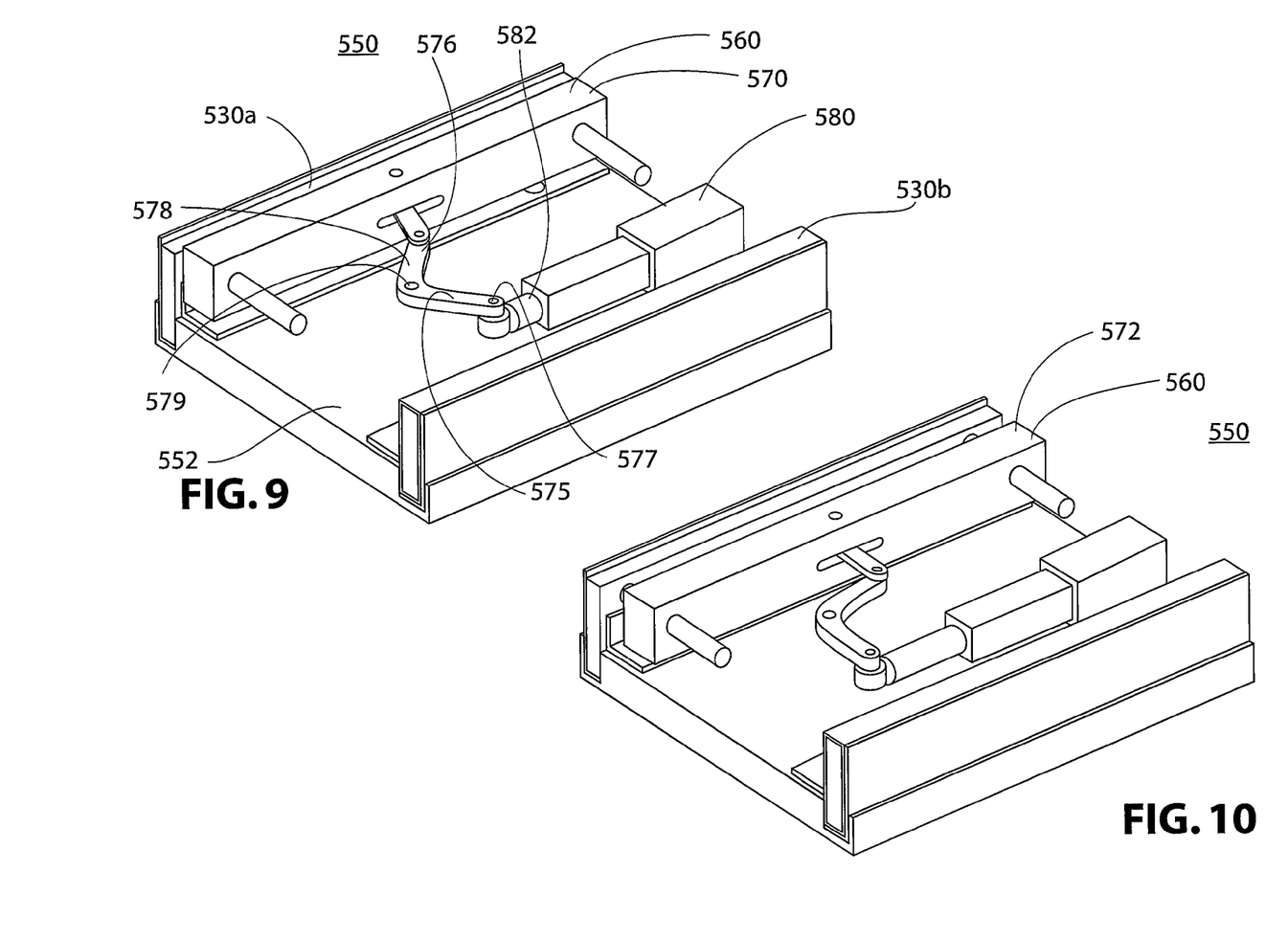
FIG. 9 is a perspective view of an adjustable shunt assembly in accordance with a second embodiment of the invention, whereby the shunt is in a first position.
FIG. 10 is a perspective view of the adjustable shunt assembly in accordance with the second embodiment of the invention, whereby the shunt is in a second position.

FIGS. 9 and 10 illustrate a second embodiment of an adjustable shunt assembly 550 having a frame 552. A positive displacement lever 575 has a first end 576 pivotably connected to the shunt 560 between two magnets 530a, 530b. The second end 577 of the lever 575 is pivotably connected to the shaft 582 of a stepper motor 580. The intermediate portion 578 of the lever 575 is pinned to the frame 552 at pin 579, such that motion of the stepper motor 580 causes rotation of the lever 575 which in turn caused displacement of the shunt 560 between a first position 570, illustrated in FIG. 9, and the second position 572, illustrated in FIG. 10, between the magnets 530a, 530b. In this configuration, however, the stepper motor 580 must be extended and retracted to reciprocate the shunt 560 between the first position 570 and the second position 572.

The shunt in each of the embodiments discussed herein may be comprised of a magnetic material or, in the alternative, be comprised of a cobalt-framed magnetic alloy. To the extent the material of the shunt is sufficient to influence the magnetic field, the shunt may be utilized for the goals of the subject invention.

Figure 11:
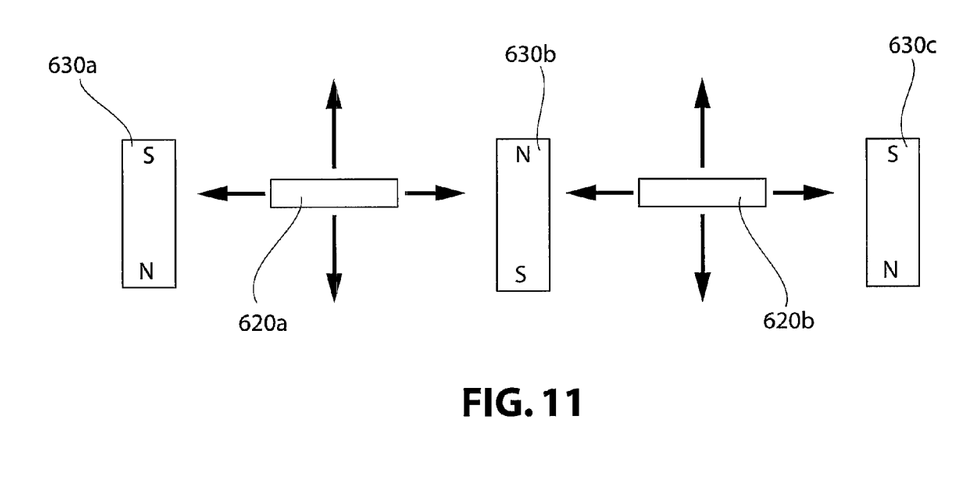
FIG. 11 is a sketch illustrating three magnets and two shunts and highlighting the directions in which the shunts may be moved for adjustment.

As previously discussed, adjustable shunt assemblies may be utilized to move the shunt in different directions relative to two adjacent magnets. As an example, FIG. 11 for a sputtering magnetron having three magnets 630a, 630b, 630c and two shunts 620a, 620b, each of the shunts 620a, 620b may be moved in any of the four directions independent of the other shunt 620a, 620b.

Figure 12:
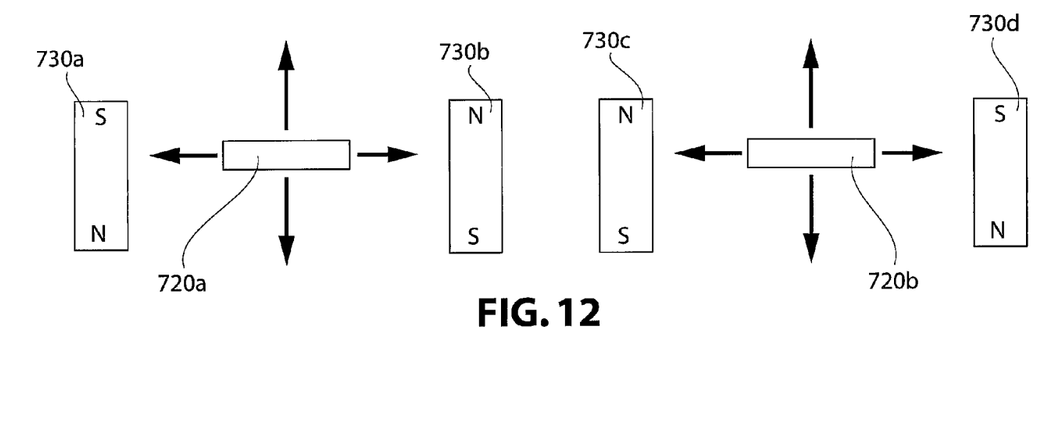
FIG. 12 is an arrangement illustrating two pairs of magnets with two shunts showing the directions the shunts may move with respect to the magnets.

Directing attention to FIG. 12, for a sputtering magnetron having four magnets 730a, 730b, 730c, 730d, it is possible to include two adjustable shunt assemblies 720a, 720b, wherein each of these shunt assemblies may move in any of the four directions illustrated by the arrows therein in concert with or independent from the other shunt 720a, 720b.

Figure 13:
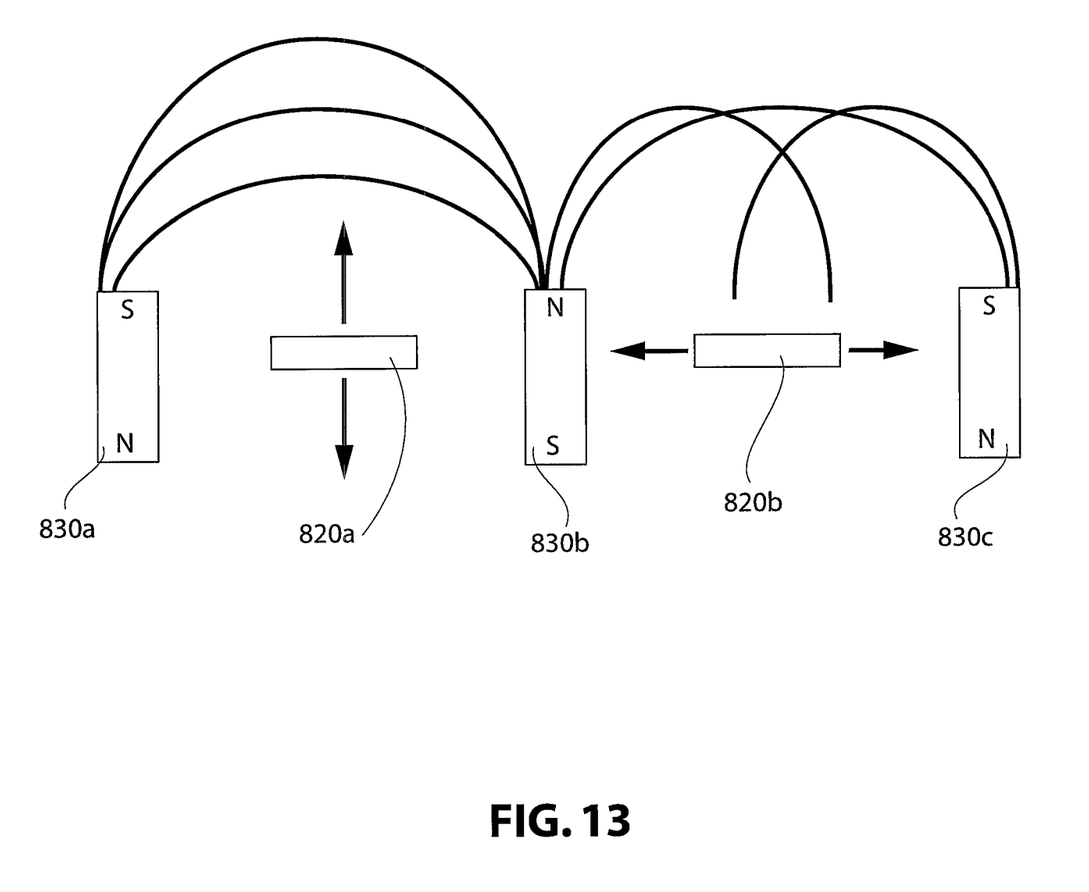
FIG. 13 is a sketch illustrating three magnets and two shunts highlighting that the motion of the shunts between the magnets may be in different directions.

Finally, FIG. 13 for a sputtering magnetron having three magnets 830a, 830b, 830c and two shunts 820a, 820b, shunt 820 may be moved vertically with respect to the magnets 830a, 830b while shunt 820b may be moved horizontally with respect to the magnets 830b, 830c. As illustrated, when shunt 820a is moved up and down, the magnetic field lines are elongated, whereas when the shunt 820b is moved laterally, the magnetic field lines intersect with one another. However, of particular note, with respect to the movement of shunt 820b, the overall profile of the magnetic filed is more uniform and, as a result, the ejection of material from the target may be more uniform.

While so far attention has been given to the individual adjustable shunt assemblies, a collection of these assemblies is intended to be used with a sputtering magnetron. Briefly returning to FIGS. 3 and 4, the sputtering magnetron 110 has a base with a longitudinal axis 153 and associated with a cathode comprised of at least two magnets 130a, 130b positioned along the longitudinal axis 153 and spaced in an opposing fashion from one another. The magnets 130a, 130b are disposed with respect to a sputtering target 115 to provide opposing north N and south S poles producing a magnetic field 132 over a sputtering target surface 117 for magnetron sputtering. The sputtering target 115 has a cathode side 116 and a sputtering surface side 117, wherein the target 132 is adapted to displace electrically charged material from the sputtering surface side 117. An anode substrate 125 has a receiving surface 127, wherein the sputtering surface side 117 of the target 115 faces the receiving surface 127 of the anode substrate 135. The anode substrate 125 is adapted to receive sputtered material from the target 115 onto the receiving surface 127. Utilizing this sputtering magnetron 110, the plurality of adjustable shunt assemblies described herein may be secured along the length of the base 112 in a manner described herein. As a result, one or more shunts may be moved in a direction perpendicular to the longitudinal axis 153, parallel to the longitudinal axis 153, or vertical with respect to the longitudinal axis 153

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the appended claims and any and all equivalents thereof.

The invention claimed is:

1. An adjustable shunt assembly for use in a sputtering magnetron having at least two magnets spaced from one another and disposed with respect to a sputtering target having a sputtering surface, wherein the magnets define a longitudinal axis therebetween, wherein the magnets are adapted to provide opposing north and south poles producing a magnetic field over the target sputtering surface for magnetron sputtering, the adjustable shunt assembly comprising:

a) a shunt positioned between two adjacent magnets for altering the magnetic field therebetween; and
b) a transporter for moving the shunt relative to the magnets within a range between first and second positions at which the magnetic field on the target surface causes preferential target erosion; and wherein
c) the assembly has a frame;
d) the transporter comprises a guide secured to the frame; and
e) the shunt is movable along the guide between the magnets.

2. The adjustable shunt assembly according to claim 1, wherein the transporter guide is oriented perpendicular to the longitudinal axis to move the shunt laterally with respect to the longitudinal axis between the magnets.

3. The adjustable shunt assembly according to claim 1, wherein the transporter guide is oriented perpendicular to the longitudinal axis to move the shunt vertically with respect to the longitudinal axis between the magnets.

4. The adjustable shunt assembly according to claim 1, wherein the transporter guide is oriented parallel to the longitudinal axis to move the shunt parallel with respect to the longitudinal axis between the magnets.

5. The adjustable shunt assembly according to claim 1, wherein the transporter guide is comprised of at least one post extending from the frame, wherein the shunt has a bore matching the outer shape of the post extending through the shunt such that the shunt may slide back and forth along a path defined by the guide.

6. The adjustable shunt assembly according to claim 5, wherein the transporter is further comprised of a positive displacement lever pivotally connected at a first end to the shunt, wherein the lever is engaged with a drive mechanism such that actuation of the drive mechanism displaces the shunt between the magnets.

7. The adjustable shunt assembly according to claim 6, wherein the transporter further includes a ratchet gear, a rotary motor, and a driving disk, wherein the gear is mounted about its center to the frame, wherein the second end of the lever is pivotally attached to a location on the gear offset the center of the gear, and wherein the driving disk is connected to the rotary motor and engages the gear teeth such that rotation of the motor rotates the driving disk and drives the gear, thereby causing the shunt to move along the guide.

8. The adjustable shunt assembly according to claim 7, wherein the transporter further includes a spring connected to the frame at one end and to the rotary motor at the other end and biased in a direction to urge the driving disk into engaging contact with the gears of the ratchet gear.

9. The adjustable shunt assembly according to claim 8, further including a position lock secured to the frame, wherein the position lock has a tab that engages the teeth of the ratchet gear to prevent rotation of the ratchet gear in one direction.

10. The adjustable shunt assembly according to claim 6, wherein an intermediate portion of the lever is pinned to the frame and the second end of the lever is pinned to a linear stepper motor such that motion of the stepper motor causes rotation of the lever which in turn causes displacement of the shunt.

11. The assembly of claim 1, wherein the shunt is composed of a magnetic material.

12. The assembly of claim 2, wherein the shunt is composed of a cobalt-framed magnetic alloy.

13. A sputtering magnetron for displacing material from a target and depositing the material onto the receiving surface of a substrate, wherein the magnetron is comprised of:
   a) a base having a cathode mounted thereto, wherein the cathode is comprised of at least two magnets defining a longitudinal axis therebetween and spaced in an opposing fashion from one another and disposed with respect to a sputtering target to provide opposing north and south poles producing a magnetic field over the target sputtering surface for magnetron sputtering;
   b) a sputtering target having a cathode side and a sputtering surface side, wherein the cathode side faces the cathode and wherein the cathode is adapted to displace electrically charged material from the sputtering surface side;
   c) an anode substrate having a receiving surface, wherein the sputtering surface side of the target faces the receiving surface of the anode substrate and wherein the anode substrate is adapted to attract the electrically charged material from the target onto the receiving surface; and
   d) a plurality of adjustable shunt assemblies secured along the length of the base, wherein each adjustable shunt assembly is comprised of:
   1) a shunt positioned between two adjacent magnets for altering the magnetic field therebetween; and
   2) a transporter for moving the shunt relative to the magnets within a range between first and second positions at which the magnetic field on the target surface causes preferential target erosion; and wherein
   3) the assembly has a frame;
   4) the transporter comprises a guide secured to the frame; and
   5) the shunt is movable along the guide between the magnets.

14. The sputtering magnetron according to claim 13, wherein each adjustable shunt assembly is mounted upon a separate frame to define an individual interchangeable module.

15. The sputtering magnetron according to claim 13, wherein the transporter guide is oriented perpendicular to the longitudinal axis to move the shunt laterally with respect to the longitudinal axis between the magnets.

16. The sputtering magnetron according to claim 13, wherein the transporter guide is oriented perpendicular to the longitudinal axis to move the shunt vertically with respect to the longitudinal axis between the magnets.

17. The sputtering magnetron according to claim 13, wherein the transporter guide is oriented parallel to the longitudinal axis to move the shunt parallel with respect to the longitudinal axis between the magnets.

18. A method for adjusting the magnetic field of a sputtering magnetron to provide preferential erosion, wherein the magnetron has at least two magnets spaced parallel from one another and defining a longitudinal axis therebetween, wherein the magnets are disposed with respect to a sputtering target having a sputtering surface, wherein the magnets are adapted to provide opposing north and south poles producing a magnetic field over the target sputtering surface for magnetron sputtering, the method comprising the steps of:
   a) providing at least one shunt between two adjacent magnets for altering the magnetic field therebetween; and
   b) moving with a transporter the at least one shunt relative to the magnets within a range between first and second positions at which the magnetic field on the target surface causes preferential target erosion; and wherein
   c) the transporter comprises a guide secured to the frame; and
   d) the shunt is movable along the guide between the magnets.

19. The method for adjusting the magnetic field of a sputtering magnetron according to claim 18, wherein the step of moving the at least one shunt relative to the magnets is comprised of moving the shunt between the magnets laterally with respect to the longitudinal axis defined by the opposing magnets.

20. The method for adjusting the magnetic field of a sputtering magnetron according to claim 18, wherein the step of moving the at least one shunt relative to the magnets is comprised of moving the shunt between the magnets vertically with respect to the longitudinal axis defined by the opposing magnets.

21. The method for adjusting the magnetic field of a sputtering magnetron according to claim 18, wherein the step of moving the at least one shunt relative to the magnets is comprised of moving the shunt between the magnets parallel with respect to the longitudinal axis defined by the opposing magnets.

22. The method for adjusting a magnetic field of a sputtering magnetron according to claim 18, wherein the step of moving the at least one shunt relative to the magnets is comprised of moving multiple shunts between the magnets wherein at least a first shunt moves in a first direction lateral, vertical or parallel and at least a second shunt moves in a second direction lateral, vertical or parallel different from the first direction.

23. A method for adjusting the magnetic field of a sputtering magnetron to provide preferential erosion, wherein the magnetron has at least two magnets spaced from one another and disposed with respect to a sputtering target having a sputtering surface, wherein the magnets define a longitudinal axis therebetween, wherein the magnets are adapted to provide opposing north and south poles producing a magnetic field over the target sputtering surface for magnetron sputtering, the method comprising the steps of:
   a) providing a shunt positioned between two adjacent magnets for altering the magnetic field therebetween; and
   b) providing a transporter for moving the shunt relative to the magnets within a range between first and second positions at which the magnetic field on the target surface causes preferential target erosion; and wherein
   c) the transporter comprises a guide secured to the frame; and d) the shunt is movable along the guide between the magnets.

* * * * *